United States Patent [19]

Mahler

[11] Patent Number: 4,967,102
[45] Date of Patent: Oct. 30, 1990

[54] BICMOS POWER UP 3-STATE CIRCUIT HAVING NO THROUGH CURRENT IN THE DISABLED MODE

[75] Inventor: Theodor W. Mahler, Sherman, Tex.

[73] Assignee: Texas Instruments Incorporated, Dallas, Tex.

[21] Appl. No.: 363,642

[22] Filed: Jun. 8, 1989

[51] Int. Cl.⁵ .................. H03K 3/01; H03K 19/02; H03K 17/16; H03K 19/094
[52] U.S. Cl. .................................. 307/270; 307/443; 307/446; 307/451; 307/473; 307/585
[58] Field of Search ............... 307/270, 443, 446, 451, 307/473, 585

[56] References Cited

U.S. PATENT DOCUMENTS 4,678,943  7/1987  Uragami et al. .................... 307/270

Primary Examiner—Stanley D. Miller
Assistant Examiner—Trong Quang Phan
Attorney, Agent, or Firm—B. Peter Barndt; James T. Comfort; Melvin Sharp

[57] ABSTRACT

A power-up 3-state circuit implemented with BiCMOS techniques is described. The circuit disables itself and draws no through current once the operating level of the applied supply voltage is achieved.

6 Claims, 2 Drawing Sheets

BICMOS POWER UP 3-STATE CIRCUIT HAVING NO THROUGH CURRENT IN THE DISABLED MODE

BACKGROUND OF THE INVENTION

1. Field of the Invention

This invention pertains to a power saving 3-state circuit for use in integrated circuits. More particularly, the invention pertains to a BiCMOS power-up circuit that disables itself and draws no through current once operating voltage for the integrated circuit is achieved.

2. Description of Prior Art

In integrated circuits (IC's) having 3-state outputs, ON, OFF and electrically disabled, it is desirable to have the circuit output in the disabled mode during the time when the IC is powering up, typically between 0 volts and 3.5 volts, to attain the applied supply voltage (Vcc). This prevents the circuits from attempting to place a logic high or low signal on a bus while the supply voltage Vcc is ramping up from 0 volts. Such a condition is found in systems where a card containing 3-state circuits, attached to a bus, is powered down separately from the remainder of the system in order to conserve system power.

Although power-up 3-state circuits have been implemented in bipolar circuits, such circuits use signals opposite in phase for BiCMOS needs and continue to draw current after supply voltage has ramped up to Vcc. In BiCMOS circuits, where the total circuit current, Icc, in the disabled state may be only a few milliamps, the current used by the power-up 3-state circuit after the operating level of Vcc is reached may be a significant percentage of the total current and cause undesirable power-consumption by the IC circuit. The present invention avoids these limitations of prior art circuits by providing a BiCMOS power-up in 3-state circuit which generates signals having the correct phase for BiCMOS applications and which disables itself once the operating level of the supply voltage Vcc is achieved, thus drawing no Icc current.

SUMMARY OF THE INVENTION

A principal object of the invention is to provide a power saving 3-state circuit for use in BiCMOS integrated circuits.

A further object of the invention is to provide a power-up 3-state BiCMOS circuit that draws no through current once the operating level of the applied supply voltage is achieved.

DESCRIPTION OF THE PREFERRED EMBODIMENT

Figure 1:
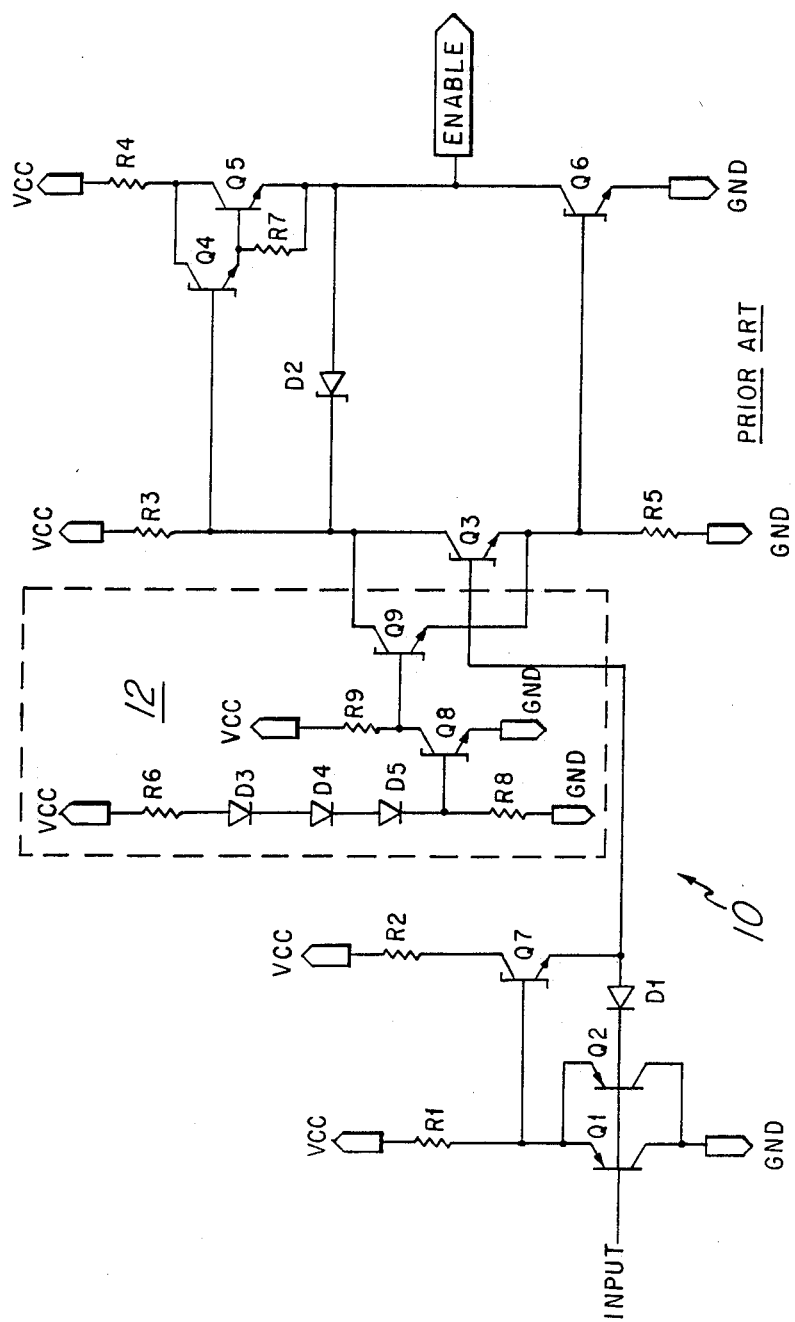
FIG. 1 illustrates a conventional power-up 3-state circuit as used in a conventional enable buffer.

Referring to FIG. 1, an enable buffer 10 is shown including a conventionally implemented bipolar power-up 3-state circuit 12. In this case, the enable buffer 10 receives an input signal and generates an enable signal which, at a low voltage of 0.2 volts for example, pulls certain nodes in an output buffer, not shown, low. This then disables that output buffer.

FIG. 1 shows a conventional bipolar implementation of a power-up 3-state circuit 12 of a conventional enable buffer 10. A resistor R6 and three diodes D3, D4 and D5 are serially connected between supply voltage Vcc and the base of bipolar transistor Q8. The base of Q8 is also connected to ground through resistor R8. The emitter of Q8 is connected to ground and the collector of Q8 is connected to Vcc through resistor R9 and to the base of bipolar transistor Q9. The emitters of Q9 and bipolar phase-splitter transistor Q3 are connected to ground through resistor R5 and to the base of bipolar transistor Q6. Both collectors of Q3 and Q9 are connected to Vcc through resistor R3; to the output of the enable buffer through reverse-biased Schottky diode D2; and to the input of Darlington transistor pair Q4-Q5. The base of phase-splitter Q3 is coupled to input circuitry receiving input signals to the buffer.

Operation of the power-up 3-state circuit 12 begins as the supply voltage Vcc reaches a voltage level (1.6 volts) sufficient to forward bias bipolar transistors Q6 and Q9. Once this voltage is reached, resistor R9 permits sufficient current flow to keep transistors Q6 and Q9 on. Resistor R8 holds the base of bipolar transistor Q8 at ground potential keeping it off. No current flows through diodes D3, D4 and D5 at this level of Vcc because the voltage level is insufficient to forward bias them. Since transistor Q9 is ON, it supplies base drive current to transistor Q6, thereby bypassing bipolar phase-splitter transistor Q3. With transistor Q6 turned ON, the output of the enable buffer 10 is kept at a logical low voltage signal which disables the output buffer regardless of the voltage signal at the input of the enable buffer. Transistors Q6 and Q9 remain ON until the supply voltage reaches a voltage level (3.2 volts) sufficient to forward bias transistor Q8 and diodes D3, D4 and D5 through resistor R6. When this voltage is reached, transistor Q8 will turn ON and pull the base of transistor Q9 to 0.2 volts, turning it OFF. With transistor Q9 OFF, the output of the enable buffer is now determined by the level of the voltage signal input to the enable buffer 10.

Two problems arise when using a typical power-up 3-state circuit to control enable buffers during Vcc ramp-up, especially when they control output buffers designed with BiMOS circuit design techniques. These output buffers use P-channel devices to disconnect VCC from the remainder of the circuit in the disabled mode, thus achieving a power reduction. Control of the P-channel devices is effected via the enable line from the enable buffer. For the P-channel devices to disconnect from VCC, they must receive a logical high voltage signal. This is the opposite result obtained when using the typical power-up 3-state circuit for control of the enable buffer output during Vcc ramp-up. The second problem with typical enable buffer circuits implemented with conventional power-up 3-state circuits is that of current drawn by the power-up 3-state circuit after the operating level of the supply voltage is reached and the circuit is in the disabled mode. A typical value of current consumed in the disabled mode for conventional power-up 3-state circuits is 0.66 mA. In integrated circuits having multiple enable buffers, current consumed is multiplied by the number of power-up 3-state circuits used. In integrated circuits having, for example, four enable circuits, the total circuit current, Icc, in the disabled mode may be almost doubled by the excess current drawn by the power-up 3-state circuit. It is very desirable to eliminate this excess current and thereby to reduce the overall power consumption of systems using these circuits.

Figure 2:
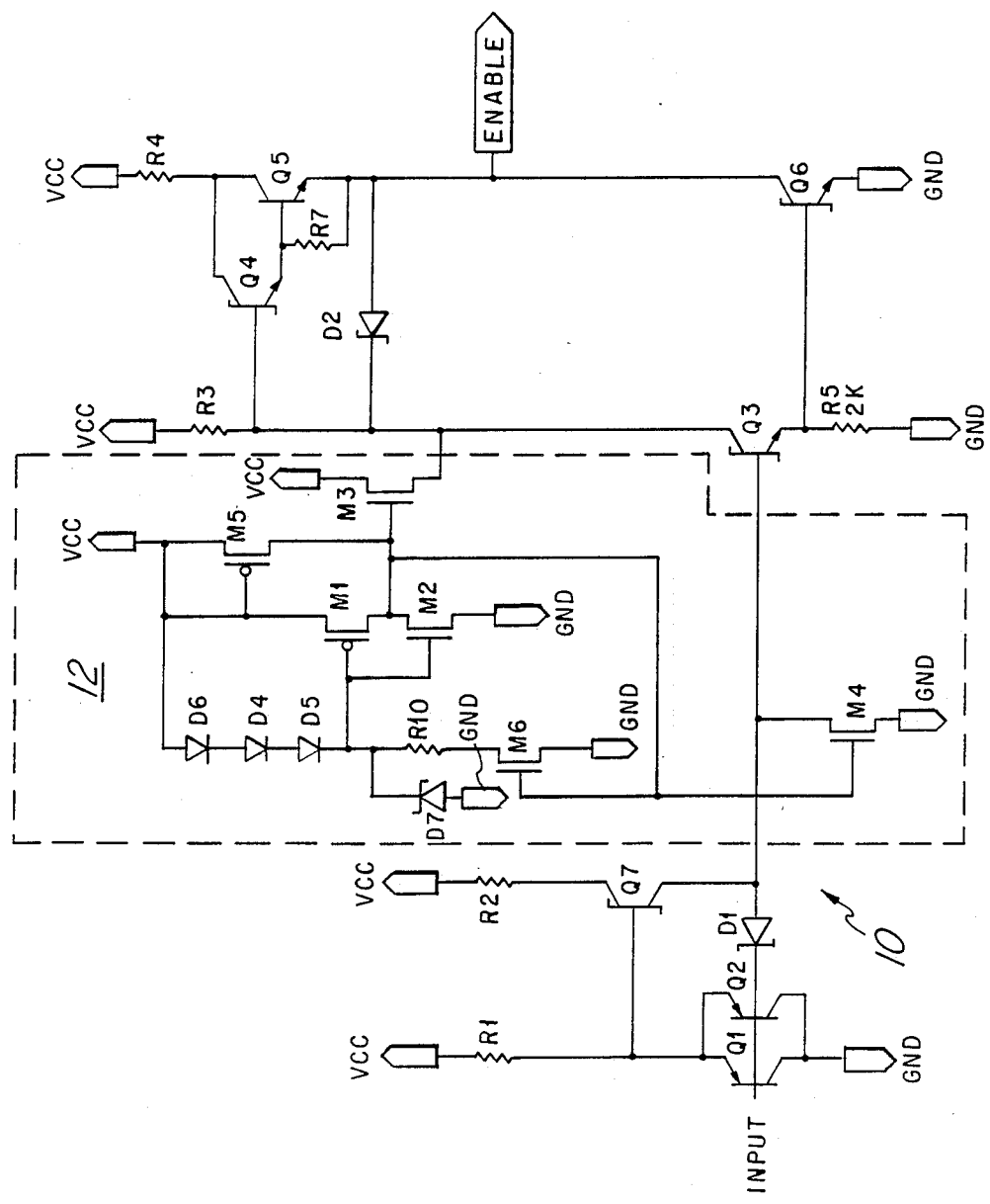
FIG. 2 illustrates a power-up 3-state circuit according to the present invention in a conventional enable buffer.

The enable buffer 10 of FIG. 1 is shown in FIG. 2 with a power-up 3-state circuit implemented with CMOS components according to the invention. Like elements in the two figures have like reference numerals.

CMOS inverter M1-M2 is connected between supply voltage Vcc and ground. Schottky diode D6 and diodes D4, D5 are serially connected between Vcc and the gate of the inverter M1-M2. The input of the inverter is coupled to ground through reverse-biased Schottky diode D7 and through serially connected resistor R10 and NMOS transistor M6. The gate of M6 is connected to the output of the inverter and to the gate of NMOS transistor M4 which is connected between ground and the input circuitry of the enable buffer 10. PMOS transistor M5 has a source and gate connected to Vcc and a drain connected to the output of the inverter. NMOS transistor M3 has a gate connected to the output of the inverter, a source connected to Vcc and a drain connected to the input of Darlington transistors Q4-Q5; the output of the buffer 10 through reverse-biased Schottky diode D2; and the collector of phase-splitter Q3. The base of Q3 is connected to input circuitry as in FIG. 1 and to the source of NMOS transistor M4. The emitter of Q3 is connected as in FIG. 1 to ground through resistor R5 and to the base of transistor Q6.

In operation of the CMOS power-up 3-state circuit, as Vcc begins to increase from 0.0 volts towards operating voltage, the gate of the CMOS inverter M1-M2 will be kept close to ground potential by the leakage current of reverse-biased diode D7. PMOS transistor M5 provides a small amount of leakage current to help the output voltage signal of the CMOS inverter M1-M2 rise with Vcc. The two leakage currents from D7 and M5 are needed to establish the initial conditions of the power-up 3-state circuit because of its latch type operation. This latching operation results from the input signal level of the CMOS inverter M1-M2 being determined by its output voltage which also controls transistor M6. Without the leakage current components, the power-up 3-state circuit will become balanced as Vcc increases to operating voltage in which case the input signal to the inverter will equal the output signal and current will be conducted from Vcc through the inverter to ground.

Once the CMOS inverter operation is established, its input is kept at ground potential by transistor M6 and resistor R10. Transistor M6 is kept in the ON condition by the high voltage level of the CMOS inverter output as it follows Vcc. As the inverter output rises above the threshold voltage level (approximately 1.0 volts) of transistors M3 and M4, the transistors turn ON. Transistor M3 supplies current to the base of the Darlington transistor pair Q4-Q5 while transistor M4 conducts current away from the base of phase-splitter transistor Q3 keeping it in the OFF condition. Under these conditions, the output voltage signal level of the enable buffer 10 will increase with the increase in Vcc, thus placing the output buffer in a disabled mode during the interval in which Vcc increases to its operational level.

When the supply voltage Vcc is high enough to forward bias diodes D4, D5 and D6, the voltage at the gate of the inverter will begin to track the increase in Vcc at a level equivalent to the voltage drops across the diodes. Thus, the voltage level on the gate of the inverter will be approximately 2.1 volts below Vcc. As the gate voltage on CMOS inverter M1-M2 rises, the threshold voltage of transistor M2 is crossed, approximately 1.0 volts, which begins to turn M2 ON. When the gate voltage of CMOS inverter M1-M2 reaches 1.3 volts, transistor M2 will be sufficiently conducting to pull the output of the inverter to ground. When this condition occurs, transistors M3 and M4 turn OFF and the output of the enable buffer 10 is then determined by the voltage signal input to the buffer rather than by the output of the power-up 3-state circuit 12. Transistor M6, which is driven from the output of the CMOS inverter M1-M2, will also turn OFF under the above conditions thus removing the current path from the serially connected diodes D4, D5 and D6. Under this condition, the power-up 3-state circuit has no current path from Vcc to ground. With no current flowing through D4, D5 and D6 other than leakage current, the voltage drop across the diodes diminishes and the voltage level on the gate of CMOS inverter M1-M2 rises. Additionally, the gate-width ratio of M1 to M2 is made to be approximately 0.67, thus lowering the threshold voltage of the inverter. Under such conditions, the P-channel transistor M1 is completely turned OFF and will not conduct current.

We claim:

1. A power-up 3-state circuit controlling an output line of an enable buffer, said 3-state circuit comprising:
   a CMOS inverter coupled between a source of supply voltage and ground;
   a voltage divider circuit coupled to an input gate and an output of said inverter;
   a first current source coupled between the gate of the inverter and ground;
   a second current source coupled between the supply voltage and the output of the inverter;
   a first switch receiving the output of said inverter and coupled between the supply voltage and a phase splitter of said buffer, said first switch selectively supplying a disable output signal to the output line of said buffer; and
   a second switch receiving the output of said inverter and coupled between input circuitry of said buffer and ground, said second switch selectively transmitting, said output signal to the output line of said buffer.

2. The 3-state circuit of claim 1 wherein said voltage divider further includes at least one diode connected between the supply voltage and the gate of the inverter and resistor serially connected with an NMOS transistor between the gate of the inverter and ground.

3. The 3-state circuit of claim 2 wherein said first current source is a reversed biased diode connected between the gate of the inverter and ground.

4. The 3-state circuit of claim 1 wherein said second current source is a PMOS transistor having a gate and a drain connected to the source of supply voltage.

5. The 3-state circuit of claim 1 wherein said first switch is a first NMOS transistor having a gate connected to the output of the inverter, a source connected to the source of supply voltage and a drain coupled to the phase-splitter and to the output line of the enable buffer.

6. The 3-state circuit of claim 1 wherein said second switch is a second NMOS transistor having a gate connected to the output of the CMOS inverter, a source connected to the input circuitry of the buffer and to the phase-splitter and a drain connected to ground.

* * * * *